(12) United States Patent
Sai

(10) Patent No.: US 6,658,083 B2
(45) Date of Patent: Dec. 2, 2003

(54) WEIGHT COMPENSATION APPARATUS, STAGE APPARATUS USING THE SAME, AND EXPOSURE APPARATUS

(75) Inventor: Choshoku Sai, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 43 days.

(21) Appl. No.: 09/878,337

(22) Filed: Jun. 12, 2001

(65) Prior Publication Data

US 2001/0053196 A1 Dec. 20, 2001

(30) Foreign Application Priority Data

Jun. 14, 2000 (JP) .................................... 2000-178691
Jun. 1, 2001 (JP) .................................... 2001-167195

(51) Int. Cl.[7] ............................ G21K 5/00; F16C 32/06
(52) U.S. Cl. ...................................... 378/34; 384/116
(58) Field of Search ........................... 378/34; 384/116, 384/279, 446, 107; 310/90.5

(56) References Cited

U.S. PATENT DOCUMENTS

| | | | | |
|---|---|---|---|---|
| 2,760,832 A | * | 8/1956 | Bidwell | 384/116 |
| 3,703,322 A | * | 11/1972 | Gustafsson | 384/116 |
| 3,782,791 A | * | 1/1974 | Neumann et al. | 384/116 |
| 4,060,288 A | * | 11/1977 | Arsenius et al. | 384/116 |
| 4,184,721 A | * | 1/1980 | Gemein et al. | 384/116 |
| 4,632,574 A | * | 12/1986 | Wilson et al. | 384/12 |
| 4,838,710 A | * | 6/1989 | Ohta et al. | 384/100 |
| 5,098,203 A | * | 3/1992 | Henderson | 384/12 |
| 5,280,208 A | * | 1/1994 | Komura et al. | 310/90 |
| 5,430,571 A | * | 7/1995 | Witteveen | 359/216 |
| 5,524,131 A | * | 6/1996 | Uzawa et al. | 378/34 |
| 6,138,799 A | * | 10/2000 | Schröder-Brumloop et al. | 187/452 |
| 6,249,367 B1 | * | 6/2001 | Hirose | 359/210 |
| 6,325,540 B1 | * | 12/2001 | Lounsberry et al. | 378/207 |
| 6,364,525 B1 | * | 4/2002 | Mellström et al. | 378/197 |
| 6,408,045 B1 | * | 6/2002 | Matsui et al. | 378/34 |
| 6,453,001 B2 | * | 9/2002 | Watanabe et al. | 378/34 |

OTHER PUBLICATIONS

Norio Uchida et al., "A Vertical X–Y Stage for X–Ray Lithography Using SOR", Bull. of the Japan Soc. of Precision Engineering, vol. 22, No. 2 (Jun. 1988), p. 102–108.*

* cited by examiner

Primary Examiner—David V. Bruce
Assistant Examiner—Allen C. Ho
(74) Attorney, Agent, or Firm—Fitzpatrick, Cella, Harper & Scinto

(57) ABSTRACT

A weight compensation apparatus for compensating for a weight of a stage that is movable along a vertical reference plane including a pulley having a pulley shaft, a belt which is wound around and supported by the pulley, and has the stage at one end and a counter mass corresponding to the stage at the other end, and a hydrostatic bearing which has an arcuated bearing portion, and supports the pulley shaft by causing a fluid to flow into a bearing gap between the bearing portion and the pulley shaft.

19 Claims, 12 Drawing Sheets

FIG. 7

```
URL  http://www.maintain.co.jp/db/input.html

TROUBLE DB INPUT WINDOW

OCCURRENCE DATE  [2000/3/15]~704
TYPE OF APPARATUS  [* * * * * * * * *]~701
SUBJECT            [OPERATION ERROR (START-UP ERROR)]~703
APPARATUS S/N      [465NS4580001]~702
DEGREE OF URGENCY  [D]~705
SYMPTOM   [LED KEEPS FLICKERING AFTER
           POWER-ON]                          ~706

REMEDY    [POWER ON AGAIN
           (PRESS RED BUTTON IN ACTIVATION)]  ~707

PROGRESS  [INTERIM HAS BEEN DONE]             ~708

(SEND) (RESET)    710              711            712
LINK TO RESULT LIST DATABASE   SOFTWARE LIBRARY   OPERATING GUIDE
```

WEIGHT COMPENSATION APPARATUS, STAGE APPARATUS USING THE SAME, AND EXPOSURE APPARATUS

FIELD OF THE INVENTION

The present invention relates to an alignment apparatus, a device apparatus, a measurement apparatus, and a processing apparatus for an exposure apparatus used in the lithography steps in the process of manufacturing a semiconductor or the like, and a weight compensation apparatus and the stage apparatus used in the above apparatuses.

BACKGROUND OF THE INVENTION

An apparatus called a stepper is conventionally known as an exposure apparatus used in the manufacture of a semiconductor device or the like. The stepper two-dimensionally moves a substrate step by step with respect to a projection optical system for projecting the pattern of a master such as a reticle or mask onto a substrate such as a wafer, and exposing one substrate to the pattern of the master by a plurality of number of times.

As the integration degree of a semiconductor device or the like increases, higher precision is demanded for a stage apparatus for moving a substrate such as a wafer step by step and aligning it with respect to the projection optical system of the stepper.

An X-ray exposure apparatus using an exposure beam such as a soft X-ray (charged-particle storage ring radiation) which has recently been developed adopts a vertical stage which vertically holds a substrate such as a wafer and two-dimensionally moves it step by step within a vertical or approximate reference plane. This vertical stage requires, e.g., a counter mass mechanism for compensating for the weight of the stage in order to move the stage in the gravitational direction.

FIG. 10 is a schematic view showing the pulley weight compensation mechanism of a vertical stage according to the prior art. This mechanism is an X-Y stage having a Y stage 1020 which freely reciprocates along the Y-axis (vertical direction) along a surface plate 1010 standing on a base plate 1010a, an X stage 1030 which freely reciprocates along the X-axis on the Y stage 1020, an actuator (not shown) for moving the Y stage 1020 along the Y-axis, and a linear motor (not shown) for moving the X stage 1030 along the X-axis.

The surface plate 1010 has a guide surface which supports the lower surface of the Y stage 1020 in a non-contact manner via an air pad or the like. A Y guide (yaw guide; not shown) for guiding the Y stage 1020 along the Y-axis is attached to one end of the surface plate 1010. The Y guide and Y stage 1020 are also held in a non-contact manner via an air pad or the like.

A weight compensation mechanism 1060 for canceling the weights of the Y stage 1020, the X stage 1030, and a wafer or the like (not shown) held by them comprises a belt 1062 which suspends the Y stage 1020 at one end and a counter mass 1061 at the other end, and a pulley 1063 which supports and winds the belt 1062 around it. The weight of the counter mass 1061 is set to be balanced with the weight of the stage movable portion including the Y stage 1020, the X stage 1030, and a wafer or the like held by them.

There is proposed a method using a full radial hydrostatic bearing 1190 as a bearing which supports a pulley 1163, as shown in FIG. 11. FIG. 11 is a view showing a full radial hydrostatic bearing used at a pulley bearing portion according to another prior art arrangement. In FIG. 11, a reference numeral 1110 denotes a surface plate; 1190a, a bearing base; and 1190b, a hydrostatic bearing.

Since the prior art arrangements use a full radial bearing, if the shaft is not eccentric, the pressures in upper and lower bearing gaps cancel each other, and no load-carrying capacity is applied. That is, because equal power is applied to the shaft from its perimeter, the combination power to the shaft is counterbalanced when there is no eccentricity of the shaft. The full radial bearing requires a relative eccentricity between the shaft and the bearing in order to support the load. In some cases, the eccentric amount may be restricted, and the load-carrying capacity of the hydrostatic bearing may become insufficient. That is, a radial bearing of the perimeter type is suitable for supporting the rotation of the shaft, but it is not suitable for compensating for the weight of the shaft.

SUMMARY OF THE INVENTION

The present invention has been made to overcome the conventional drawbacks, and has as its object to increase the load-carrying capacity of a hydrostatic bearing for supporting a pulley shaft in a weight compensation apparatus using a pulley.

It is another object of the present invention to provide a stage apparatus having the weight compensation apparatus.

The present invention provides a weight compensation apparatus for compensating for a weight of a stage movable along a vertical reference plane, comprising: a pulley; a belt which is wound around and supported by the pulley, and has the stage at one end and a counter mass corresponding to the stage at the other end; and a hydrostatic bearing which has an arcuated bearing portion, and supports a pulley shaft by flowing a fluid into a bearing gap between the bearing portion and the pulley shaft of the pulley.

The present invention provides a stage apparatus comprising: a stage which moves in at least a vertical direction along a vertical reference plane; a pulley disposed above the stage; a belt which is wound around and supported by said pulley, and has the stage at one end and a counter mass corresponding to the stage at the other end; and a hydrostatic bearing which has an arcuated bearing portion, and supports a pulley shaft by flowing a fluid into a bearing gap between the bearing portion and the pulley shaft of the pulley.

The present invention provides an exposure apparatus using the stage.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 7 is a view showing an example of a user interface in the semiconductor device production system including the exposure apparatus according to the embodiment of the present invention;

DETAILED DESCRIPTION OF THE PREFERRED EMBODIMENTS

Preferred embodiments of the present invention will now be described in detail in accordance with the accompanying drawings. The present invention is not limited to these embodiments.

[Embodiment of Weight Compensation Mechanism]

Figure 1A:
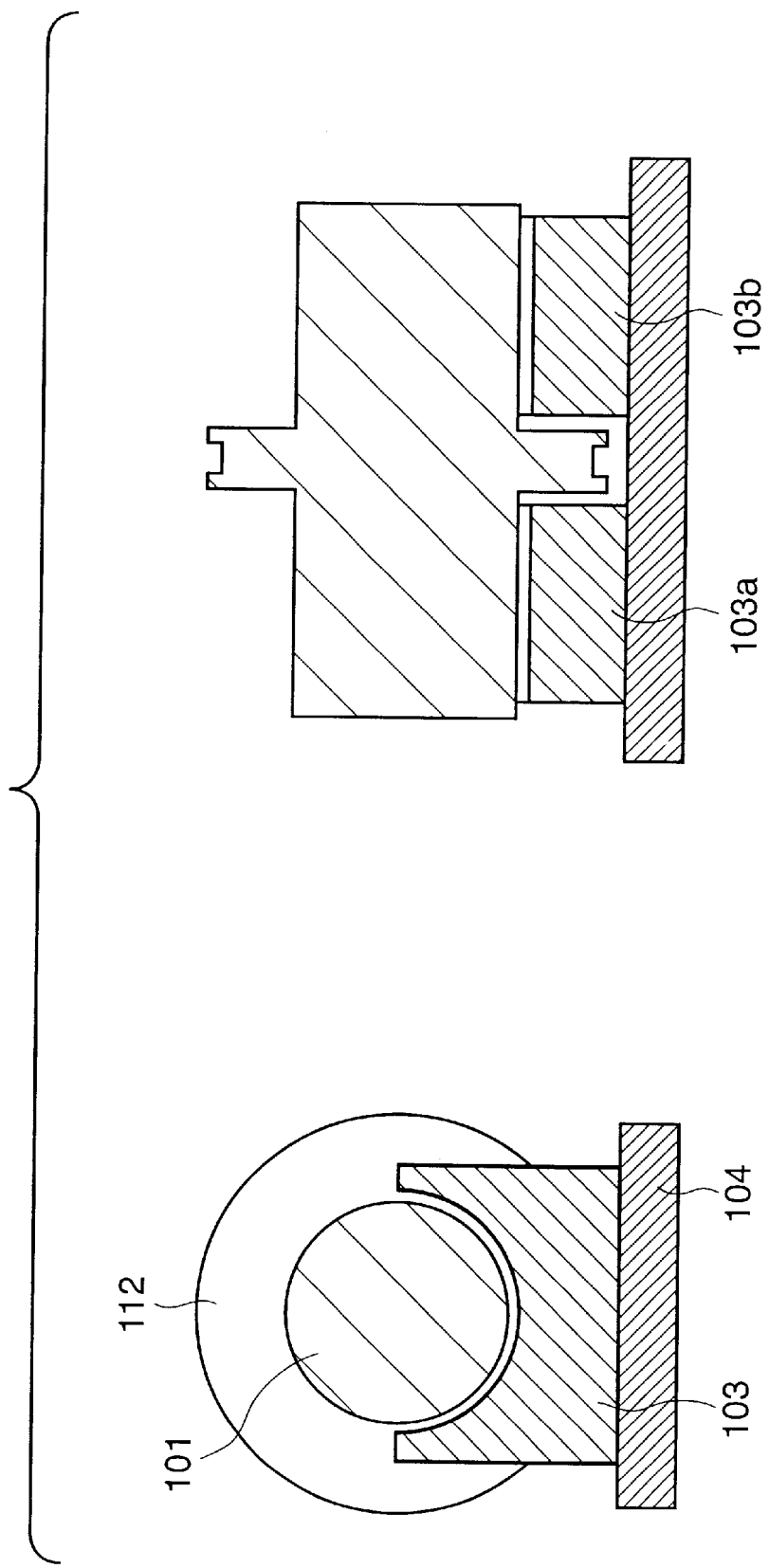
FIG. 1A is a schematic view showing the main part of a pulley mechanism according to an embodiment of the present invention.

FIG. 1A is a schematic view showing the main part of a pulley mechanism according to an embodiment of the present invention. A pulley shaft 101 integrated with a pulley 112 is supported by half hydrostatic bearings 103 (103a and 103b), and the half hydrostatic bearings 103a and 103b are fixed on a base plate 104 which supports the common bearings. A high-pressure fluid flows from an external pressure source (not shown) via the half hydrostatic bearing 103 into a small bearing gap made by the half hydrostatic bearing 103 and pulley shaft 101, and generates a high static pressure to support the pulley shaft 101.

Figure 1B:
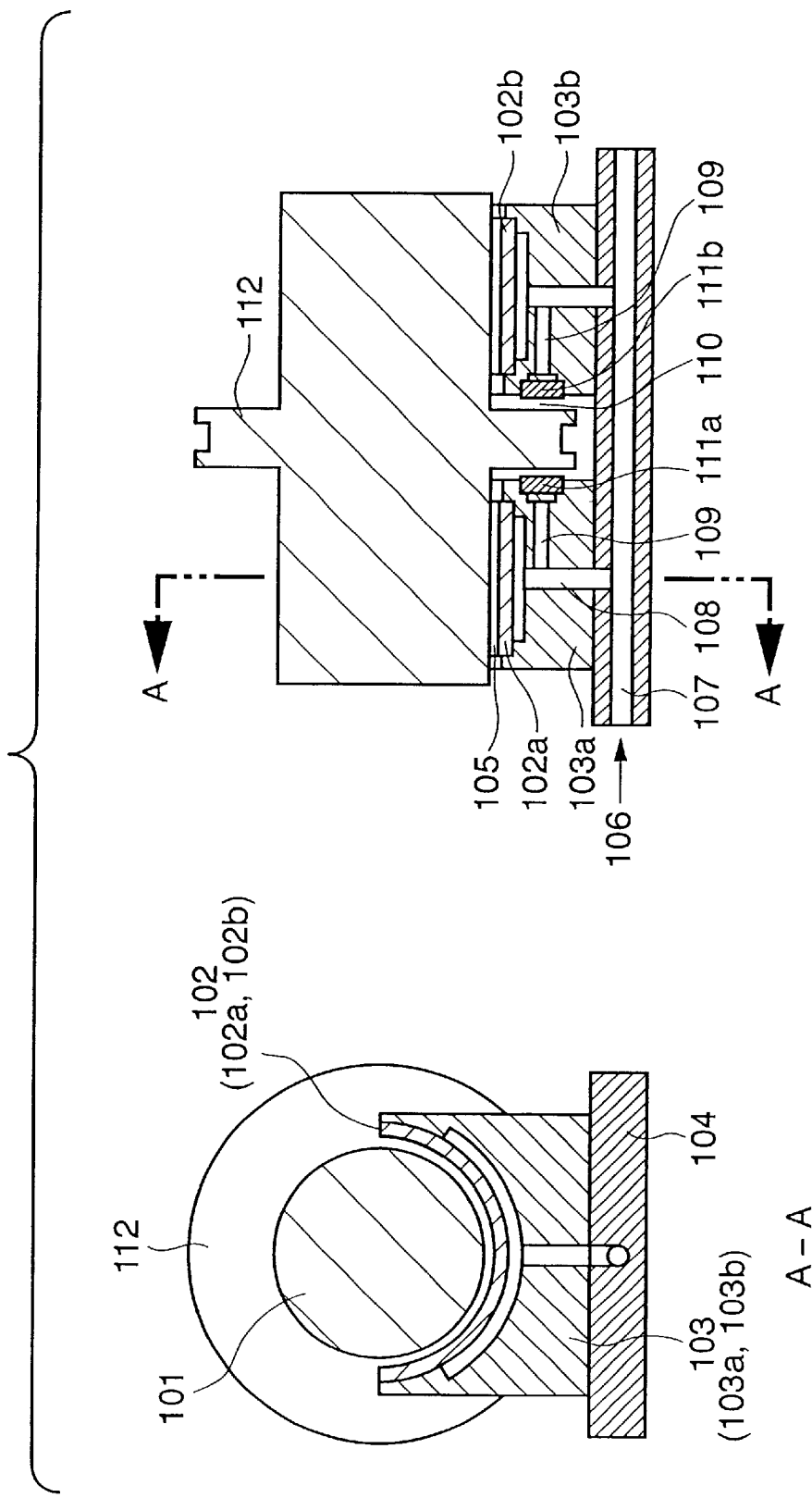
FIG. 1B is a sectional view for explaining an internal structure of the pulley mechanism shown in FIG. 1A.

FIG. 1B is a sectional view for explaining an internal structure of the pulley mechanism shown in FIG. 1A. The pulley shaft 101 integrated with the pulley 112 is supported by a half hydrostatic bearing constituted by a half porous member 102 (102a and 102b) and a housing 103 (103a and 103b) which supports it. The half hydrostatic bearing is fixed on the base plate 104 which supports the common bearings. Thrust hydrostatic bearings 111a and 111b are arranged to restrict the degree of freedom of the pulley 112 in the horizontal direction.

A high-pressure fluid 106 is supplied from an external pressure source (not shown) to a gas supply path 107, and flows into the porous member 102 of the half hydrostatic bearing 103 via a gas supply passage 108. The fluid 106 further flows into the thrust bearings 111a and 111b via a flow path 109. The fluid flows into a small bearing gap 105 formed by the half hydrostatic bearing (102 and 103) and pulley shaft 101 and a small bearing gap 110 formed by the thrust hydrostatic bearings 111a and 111b and pulley 112, and generates high static pressures to support the pulley shaft 101 and prevent horizontal offsets of the pulley 112.

Figure 11:
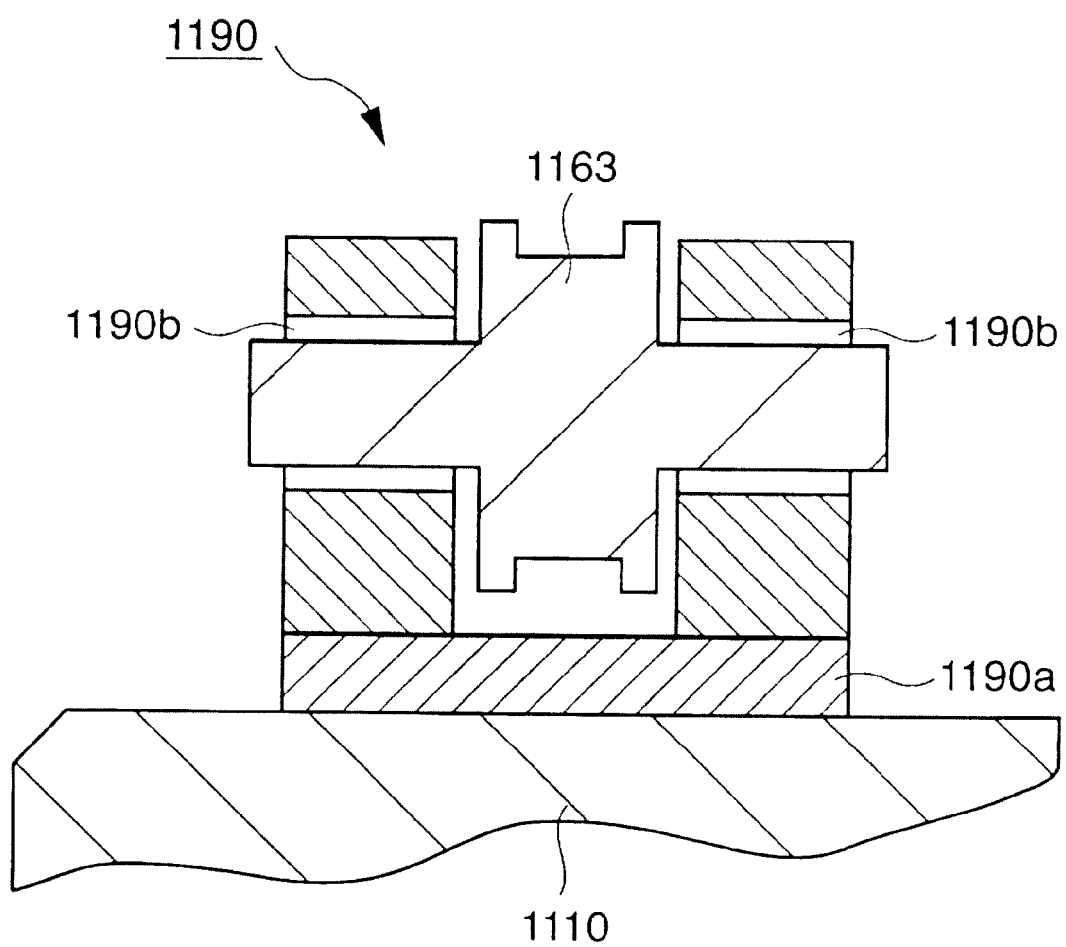
FIG. 11 is a view showing a full radial hydrostatic bearing used at a pulley bearing portion according to another prior art arrangement.

In the half hydrostatic bearing 103, compared to the conventional full hydrostatic bearing 1190 shown in FIG. 11, the portion which generates a static pressure in the bearing gap to support the bearing shaft is only the lower half of that of the full hydrostatic bearing 1190. For this reason, most of static pressures in the upper and lower gaps are canceled, and the load-carrying capacity of the bearing does not decrease. The load-carrying capacity of the half hydrostatic bearing 103 according to this embodiment is almost double that of the conventional hydrostatic bearing 1190.

It can be considered that the static pressure in the gap of the bearing accomplishes the function like a spring. Therefore, a conventional full radial hydrostatic bearing 1190 receives the power of the spring from the perimeter of the shaft. As a result, upward power to support the weight of the shaft will not be generated if there is no eccentricity of the shaft. On the other hand, in the case of the half hydrostatic bearing of the embodiment, the power of the spring will be applied to the shaft from the lower side, and upward power can be generated for the shaft.

If the gap of the bearing is narrowed, there is an effect which pushes and shortens the spring, the power of the spring can be enlarged, and the rigidity of the bearing can be improved. As a result, according to the half hydrostatic bearing, if power is given to the direction by which the shaft and the bearing are brought close, the load carrying capacity of the half hydrostatic bearing can be increased.

Accordingly, it is desirable to install a pre-load mechanism. The pre-load mechanism generates the attraction by generating a magnetic force between the shaft and the bearing. For example, in the pre-load mechanism, the pre-load power is generated by installing a permanent magnet and/or the electromagnet on the bearing side, and composing the shaft of magnetic material. A permanent magnet and the like on the bearing side and the half hydrostatic bearing body may be integrated into one body. Also, the permanent magnet and the like can be arranged at the position adjacent to the half hydrostatic bearing.

In this embodiment, the bearing 103 is a half hydrostatic bearing, but the shape of the bearing portion need not strictly be a semicircle, and suffices to be a hydrostatic bearing having an arcuated bearing portion which supports the pulley shaft.

[Embodiment of Stage Apparatus]

Figure 2:
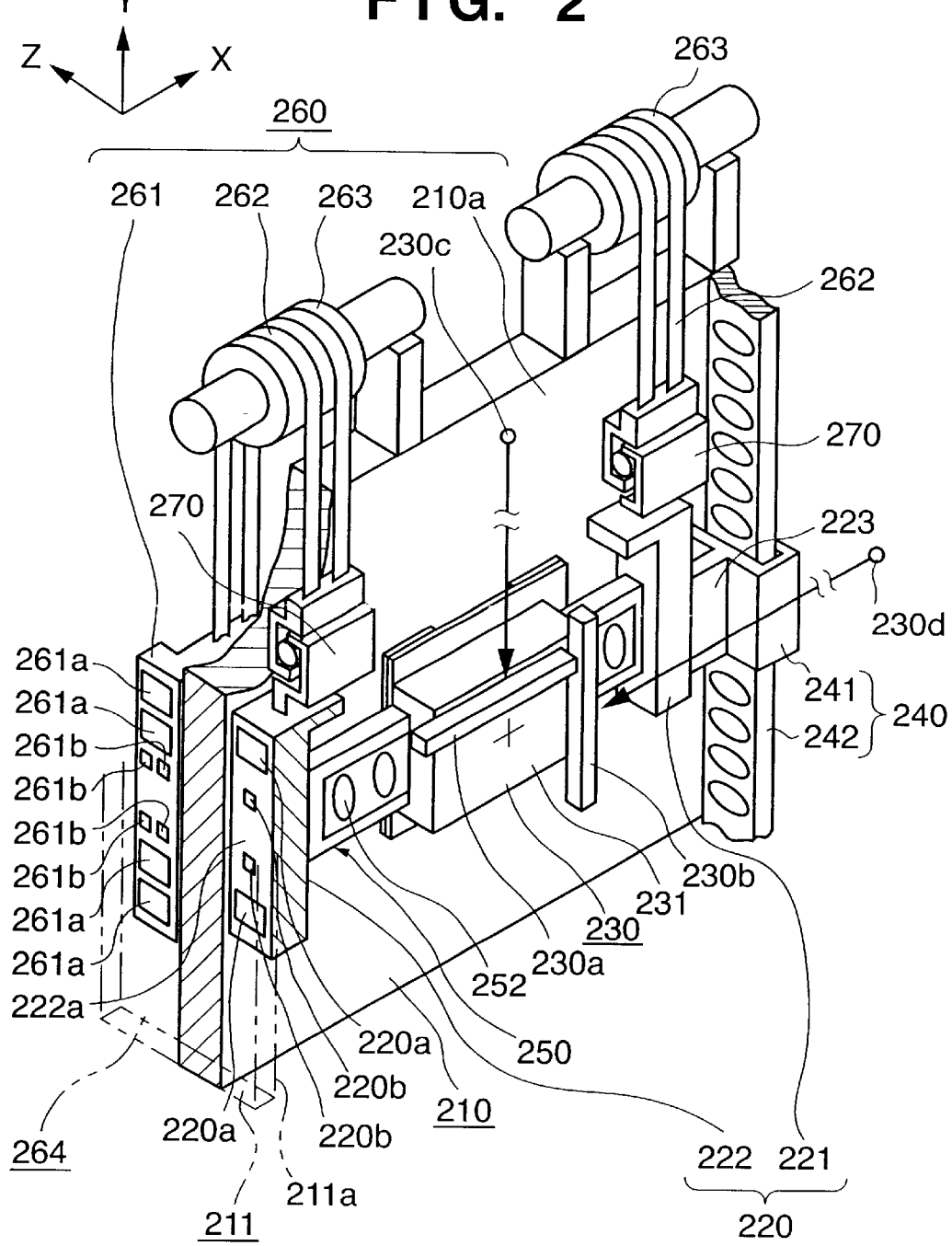
FIG. 2 is a view showing an application of a weight compensation mechanism having a half hydrostatic bearing according to the embodiment of the present invention to a stage apparatus.

FIG. 2 is a view showing an application of a weight compensation mechanism having the half hydrostatic bearing according to the embodiment of the present invention to a stage apparatus. This mechanism is an X-Y stage having a Y stage 220 which freely reciprocates along the Y-axis (vertical or approximate direction) along a surface plate 210 standing on a base plate (not shown), an X stage 230 which freely reciprocates along the X-axis on the Y stage 220, a pair of Y linear motors 240 serving as a first driving means for moving the Y stage 220 along the Y-axis, and an X linear motor 250 serving as a second driving means for moving the X stage 230 along the X-axis. The left Y linear motor 240 is not illustrated in FIG. 2 in order to describe a Y guide 211 (to be described later).

The surface plate 210 has an X-Y guide surface 210a which supports the lower surface of the Y and X stages 220 and 230 in a non-contact manner via air pads as hydrostatic bearing devices (not shown).

The Y guide 211 (represented by a broken line) serving as a yaw guide for guiding the Y stage 220 along the Y-axis stands at one end of the surface plate 210 along the X-axis. A Y guide surface 211a of the Y guide 211 and the Y stage 220 are held in a non-contact manner via air pads 220a (magnetic pads 220b) as yaw guide hydrostatic bearing devices. When the two Y linear motors 240 are driven, the Y stage 220 moves along the Y guide 211 on the X-Y guide surface 210a of the surface plate 210.

Figure 3:
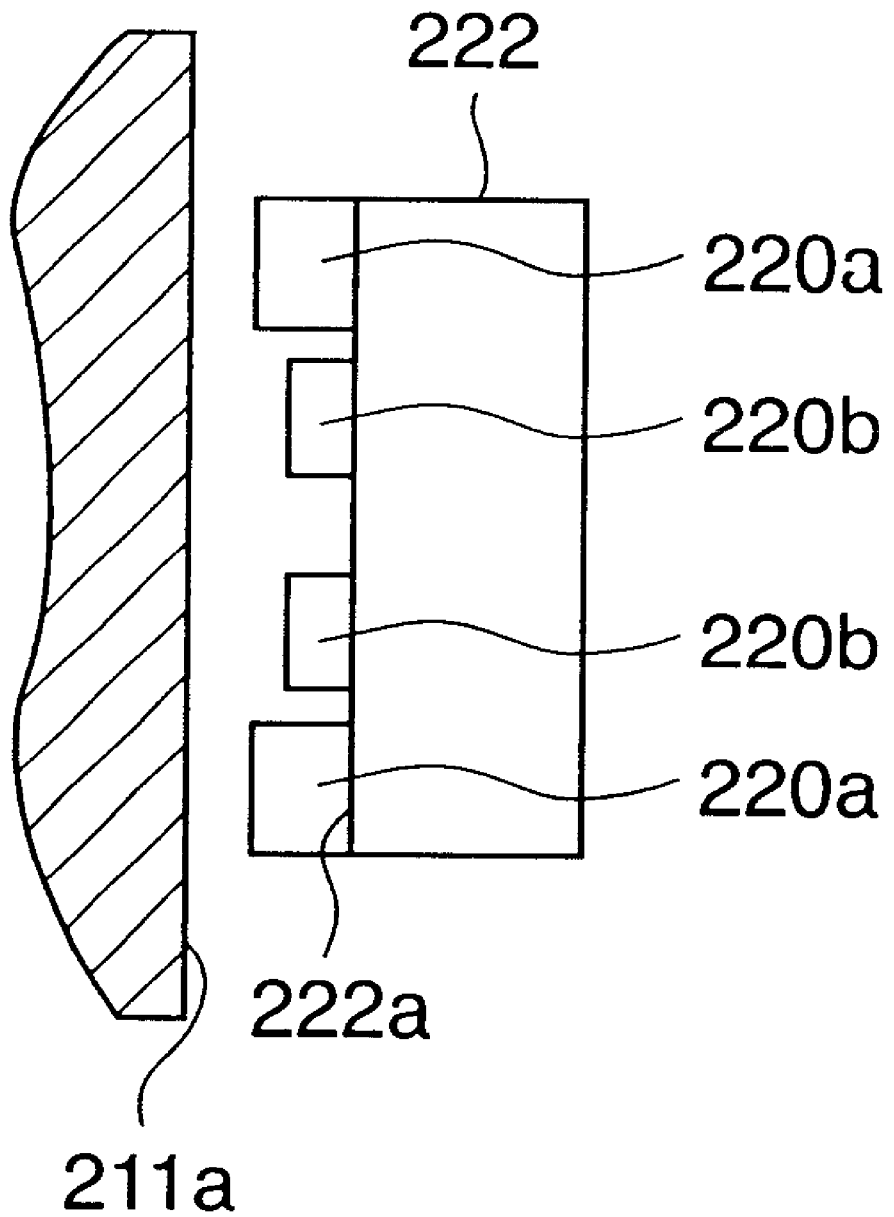
FIG. 3 is a view showing the section of the Y guide of the stage apparatus in FIG. 2.

The Y stage 220 is formed from a frame made up of a pair of Y sliders 221 and 222, and an X linear motor stationary element 252 supported by them from two ends. The lower surfaces of the Y sliders 221 and 222 face the X-Y guide surface 210a of the surface plate 210, and are supported in a non-contact manner via air pads or the like, as described above. The left Y slider 222 shown in FIG. 2 is longer than the other, and its side surface 222a faces the Y guide surface 211a of the Y guide 211 and is guided in a non-contact manner via the air pads 220a or the like, as described above (see FIG. 3). The Y sliders 221 and 222 are integrally coupled to Y linear motor movable elements 241 via connecting plates 223. FIG. 3 is a view showing the section of the Y guide 211 of the stage apparatus in FIG. 2. In FIG. 3, the same reference numerals as in FIG. 2 denote the same parts.

The X stage 230 is a hollow frame having a top plate 231, and the X linear motor stationary element 252 extends through the hollow portion. The surface of the top plate 231 forms a work stage which chucks and holds a wafer serving as a work (not shown).

The Y linear motors 240 have the Y linear motor movable elements 241 integrally coupled to the Y sliders 221 and 222 of the Y stage 220 via the connecting plates 223, as described above, and Y linear motor stationary elements 242 which extend through the openings of the Y linear motor movable elements 241.

A current supplied to each Y linear motor stationary element 242 generates a thrust along the Y-axis in a corresponding Y linear motor movable element 241, thus moving the Y and X stages 220 and 230 along the Y-axis.

The X linear motor stationary element for moving the X stage 230 along the X-axis is fixed inside the top plate 231 of the X stage 230. A current supplied to the X linear motor stationary element 252 generates a thrust along the X-axis in the X linear motor stationary element, thereby moving the X stage 230 in the X-axis direction along the X linear motor stationary element 252.

A counter mass mechanism 260 as a weight compensation mechanism for canceling the weights of the Y stage 220, X stage 230, and the like comprises belts 262 as a plurality of connecting members which suspend the Y sliders 221 and 222, i.e., Y stage 220 at one end and counter masses 261 at the other end, and pulleys 263 which support and wind the belts 262 around them. The weights of the counter masses 261 are set to be balanced with the weight of the stage movable portion including the Y stage 220, the X stage 230, and a wafer or the like held by them.

When the X stage 230 moves along the X-axis, the barycentric position of the stage movable portion including the Y and X stages 220 and 230 changes to unbalance the rotational movement around the Z-axis (ω Z-axis). Only the counter mass mechanism 260 cannot absorb this moment, and an excessive load is supplied to the Y guide (yaw guide) 211 for guiding the Y stage 220.

To prevent this, an actuator 270 as a damper for adjusting the tension and/or effective length of the belt 262 aiming at the damping in accordance with displacement of the X stage 230 is attached to the connecting portion between the Y stage 220 and each belt 262.

The tensions and/or effective length of each belt 262 can be adjusted by individually controlling the driving amount of the actuator 270 of each of the belts 262 which suspend the two Y sliders 221, on the basis of position information of the X stage 230, as will be described later. In this manner, the rotational movement generated along with movement of the X stage 230 is canceled (compensated) to reduce the load of the Y stage 220 on the Y guide 211.

The Y- and X-axis positions of the X stage 230 are respectively measured by position sensors 230c and 230d which receive beams reflected by Y and X measurement mirrors 230a and 230b integrated with the X stage 230.

In FIG. 2, reference numeral 264 denotes a counter mass yaw guide for guiding the counter mass in a non-contact manner; and 261a and 261b, air and magnetic pads as counter mass hydrostatic bearing devices.

[Embodiment of Exposure Apparatus]

Figure 4:
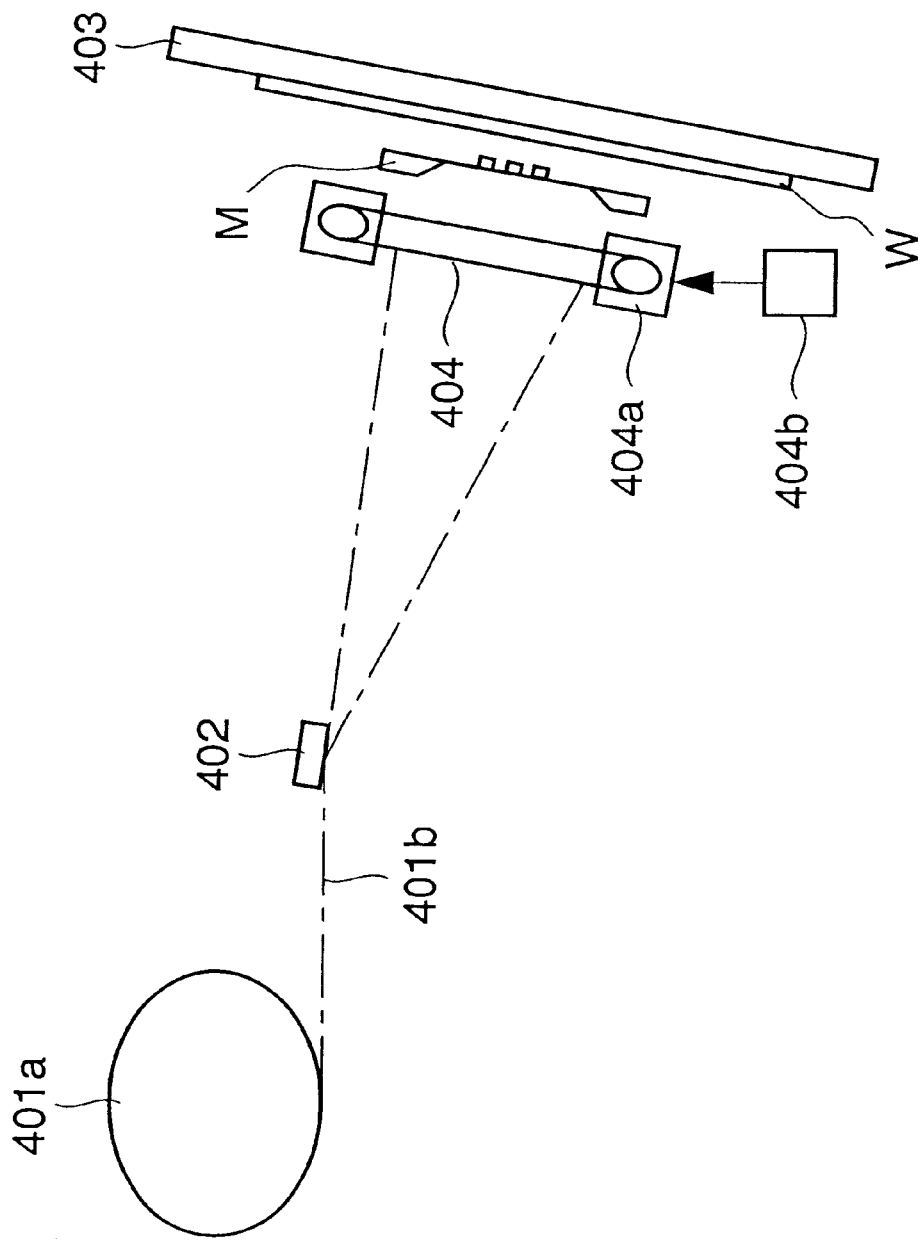
FIG. 4 is a view for explaining an X-ray exposure apparatus using the stage apparatus according to the embodiment of the present invention.

The exposure optical system of an X-ray exposure apparatus using the stage apparatus according to the embodiment of the present invention is now discussed. FIG. 4 is a view for explaining an X-ray exposure apparatus using the stage apparatus according to the embodiment of the present invention. As shown in FIG. 4, an SR beam 401b (charged-particle storage ring radiation) as an X-ray emitted by an SR generator (charged-particle storage ring) 401a is a sheet beam, and is scanned along the Y-axis by a mirror 402 apart from the emission point by a predetermined distance. The mirror 402 is not limited to one mirror and may be made up of a plurality of mirrors.

The SR beam reflected by the mirror 402 passes through a master M such as a mask bearing a pattern made of an X-ray absorber on an X-ray transmission film, and irradiates a wafer W serving as a substrate coated with a resist as a photosensitive agent. The wafer W is held by a wafer chuck 403 (work stage) on the above-described stage apparatus, and moved step by step and aligned by the stage apparatus.

A shutter 404 for controlling the exposure time is disposed upstream of the master M, and a driving device 404a of the shutter 404 is controlled by a shutter controller 404b. A beryllium film (not shown) is interposed between the mirror 402 and the shutter 404 to control the mirror side to ultrahigh vacuum and the shutter side to a reduced-pressure atmosphere of helium gas.

[Embodiment of Semiconductor Production System]

A production system for producing a semiconductor device (e.g., a semiconductor chip such as an IC or LSI, liquid crystal panel, CCD, thin-film magnetic head, micromachine, or the like) using the exposure apparatus which exploits the above-described stage apparatus will be exemplified. A trouble remedy or periodic maintenance of a manufacturing apparatus installed in a semiconductor manufacturing factory, or maintenance service such as software distribution is performed by using, e.g., a computer network outside the manufacturing factory.

Figure 5:
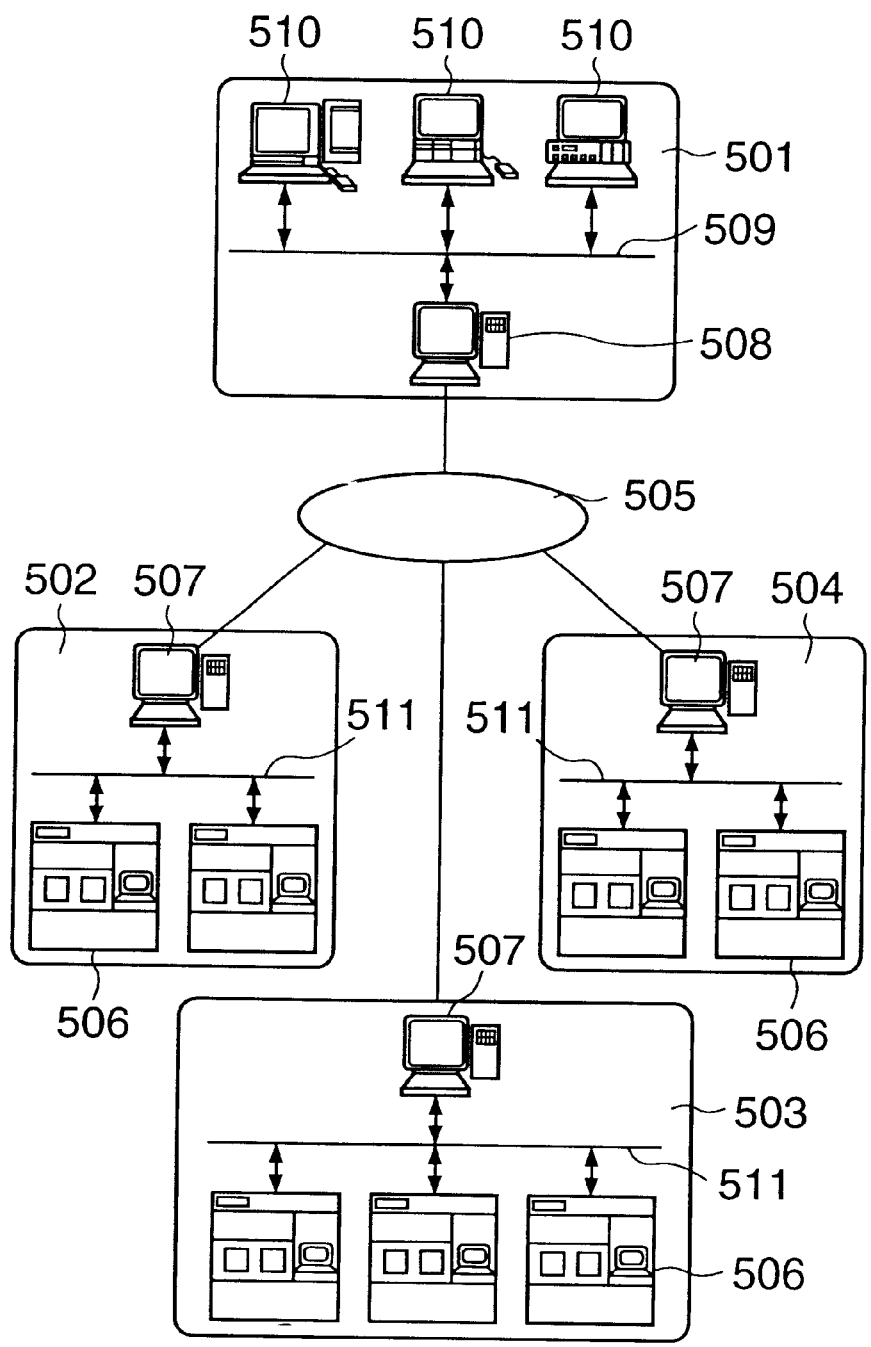
FIG. 5 is a view showing the concept of a semiconductor device production system including the exposure apparatus according to the embodiment of the present invention when viewed from a given angle.

FIG. 5 shows the overall system cut out at a given angle. In FIG. 5, reference numeral 501 denotes a business office of a vendor (apparatus supply manufacturer) which provides a semiconductor device manufacturing apparatus. Assumed examples of the manufacturing apparatus are semiconductor manufacturing apparatuses for performing various processes used in a semiconductor manufacturing factory, such as pre-process apparatuses (e.g., a lithography apparatus including an exposure apparatus, a resist processing apparatus, and an etching apparatus, an annealing apparatus, a film formation apparatus, a planarization apparatus, and the like) and post-process apparatuses (e.g, an assembly apparatus, inspection apparatus, and the like). The business office 501 comprises a host management system 508 for providing a maintenance database for the manufacturing apparatus, a plurality of operation terminal computers 510, and a LAN (Local Area Network) 509 which connects the host management system 508 and computers 510 to build an intranet. The host management system 508 has a gateway for connecting the LAN 509 to Internet 505 as an external network of the business office, and a security function for limiting external access.

Reference numerals 502 to 504 denote manufacturing factories of the semiconductor manufacturer as users of manufacturing apparatuses. The manufacturing factories 502 to 504 may belong to different manufacturers or the same manufacturer (pre-process factory, post-process factory, and the like). Each of the factories 502 to 504 is equipped with a plurality of manufacturing apparatuses 506, a LAN (Local Area Network) 511 which connects these apparatuses 506 to construct an intranet, and a host management system 507 serving as a monitoring apparatus for monitoring the operation status of each manufacturing apparatus 506. The host management system 507 in each of the factories 502 to 504 has a gateway for connecting the LAN 511 in the factory to the Internet 505 as an external network of the factory. Each factory can access the host management system 508 of the vendor 501 from the LAN 511 via the Internet 505. The security function of the host management system 508 authorizes access of only a limited user. More specifically, the factory notifies the vendor via the Internet 505 of status information (e.g., the symptom of a manufacturing apparatus in trouble) representing the operation status of each manufacturing apparatus 506, and receives response information (e.g., information designating a remedy against the trouble, or remedy software or data) corresponding to the notification, or maintenance information such as the latest software or help information. Data communication between the factories 502 to 504 and the vendor 501 and data communication via the LAN 511 in each factory adopt a communication protocol (TCP/IP) generally used in the Internet. Instead of using the Internet as an external network of the factory, a dedicated network (e.g., ISDN) having high security, which inhibits access of a third party, can be adopted. Also, the user may construct a database in addition to the one provided by the vendor and set the database on an external network, and the host management system may authorize access to the database from a plurality of user factories.

Figure 6:
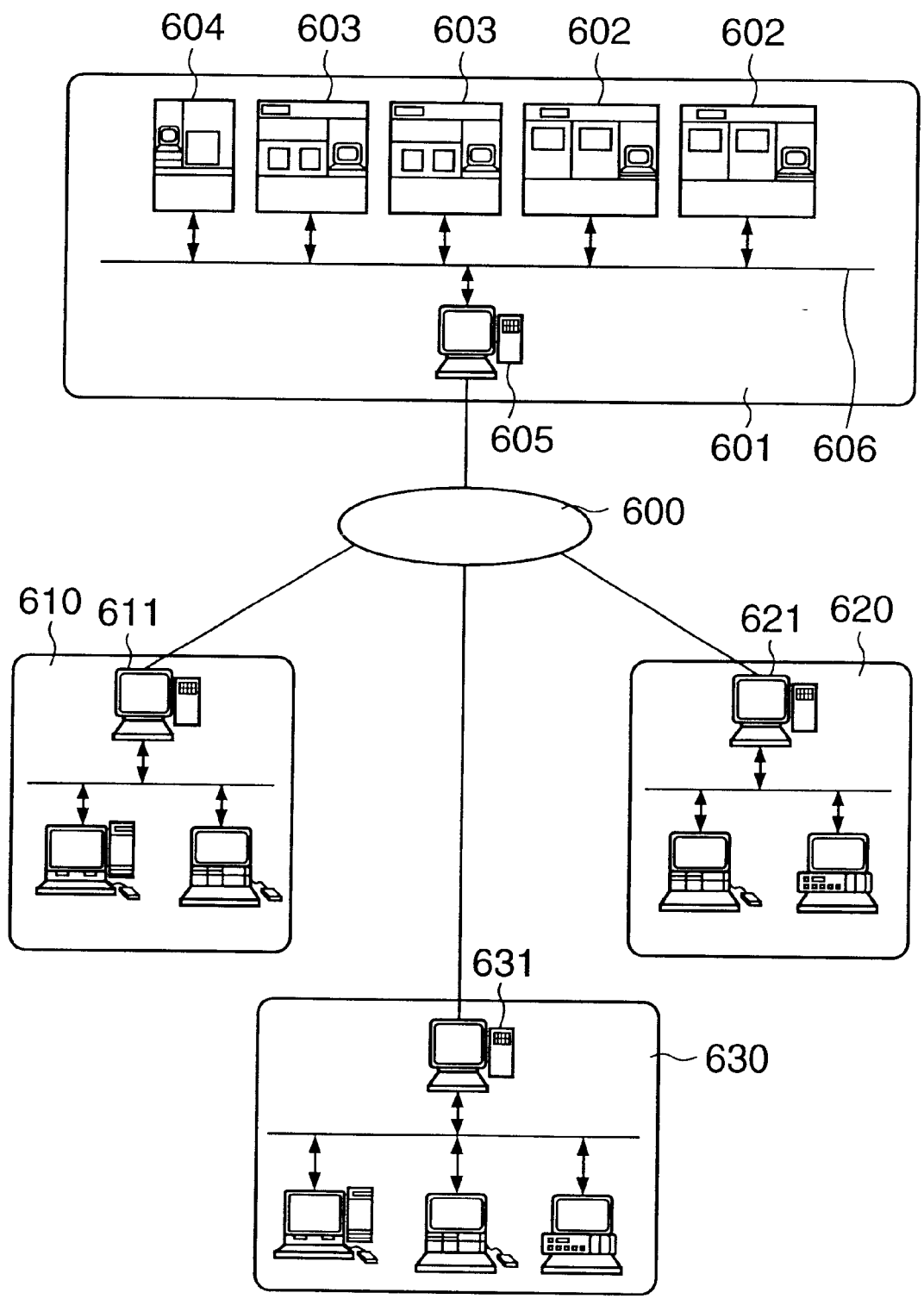
FIG. 6 is a view showing the concept of the semiconductor device production system including the exposure apparatus according to the embodiment of the present invention when viewed from another given angle.

FIG. 6 is a view showing the concept of the overall system of this embodiment that is cut out at a different angle from FIG. 5. In the above example, a plurality of user factories having manufacturing apparatuses and the management system of the manufacturing apparatus vendor are connected via an external network, and production management of each factory or information of at least one manufacturing apparatus is communicated via the external network. In the example of FIG. 6, a factory having manufacturing apparatuses of a plurality of vendors and the management systems of the vendors for these manufacturing apparatuses are connected via the external network of the factory, and maintenance information of each manufacturing apparatus is communicated. In FIG. 6, reference numeral 601 denotes a manufacturing factory of a manufacturing apparatus user (semiconductor device manufacturer) where manufacturing apparatuses for performing various processes, e.g., an exposure apparatus 602, a resist processing apparatus 603, and a film formation apparatus 604 are installed in the manufacturing line of the factory. FIG. 6 shows only one manufacturing factory 601, but a plurality of factories are networked in practice. The respective apparatuses in the factory are connected to a LAN 606 to build an intranet, and a host management system 605 manages the operation of the manufacturing line. The business offices of vendors (apparatus supply manufacturers) such as an exposure apparatus manufacturer 610, a resist processing apparatus manufacturer 620, and a film formation apparatus manufacturer 630 comprise host management systems 611, 621, and 631 for executing remote maintenance for the supplied apparatuses. Each host management system has a maintenance database and a gateway for an external network, as described above. The host management system 605 for managing the apparatuses in the manufacturing factory of the user, and the management systems 611, 621, and 631 of the vendors for the respective apparatuses are connected via the Internet or dedicated network serving as an external network 600. If trouble occurs in any one of a series of manufacturing apparatuses along the manufacturing line in this system, the operation of the manufacturing line stops. This trouble be quickly solved by remote maintenance from the vendor of the apparatus in trouble via the Internet 600. This can minimize the stoppage of the manufacturing line.

Each manufacturing apparatus in the semiconductor manufacturing factory comprises a display, a network interface, and a computer for executing network access software and apparatus operating software which are stored in a storage device. The storage device is a built-in memory, hard disk, or network file server. The network access software includes a dedicated or general-purpose web browser, and provides a user interface having a window as shown in FIG. 7 on the display. While referring to this window, the operator who manages manufacturing apparatuses in each factory inputs, in input items on the windows, pieces of information such as the type of manufacturing apparatus 701, serial number 702, subject of trouble 703, occurrence date 704, degree of urgency 705, symptom 706, remedy 707, and progress 708. The pieces of input information are transmitted to the maintenance database via the Internet, and appropriate maintenance information is sent back from the maintenance database and displayed on the display. The user interface provided by the web browser realizes hyperlink functions 710, 711, and 712, as shown in FIG. 7. This allows the operator to access detailed information of each item, receive the latest-version software to be used for a manufacturing apparatus from a software library provided by a vendor, and receive an operation guide (help information) as a reference for the operator in the factory. Maintenance information provided by the maintenance database also includes information concerning the present invention described above. The software library also provides the latest software for implementing the present invention.

Figure 8:
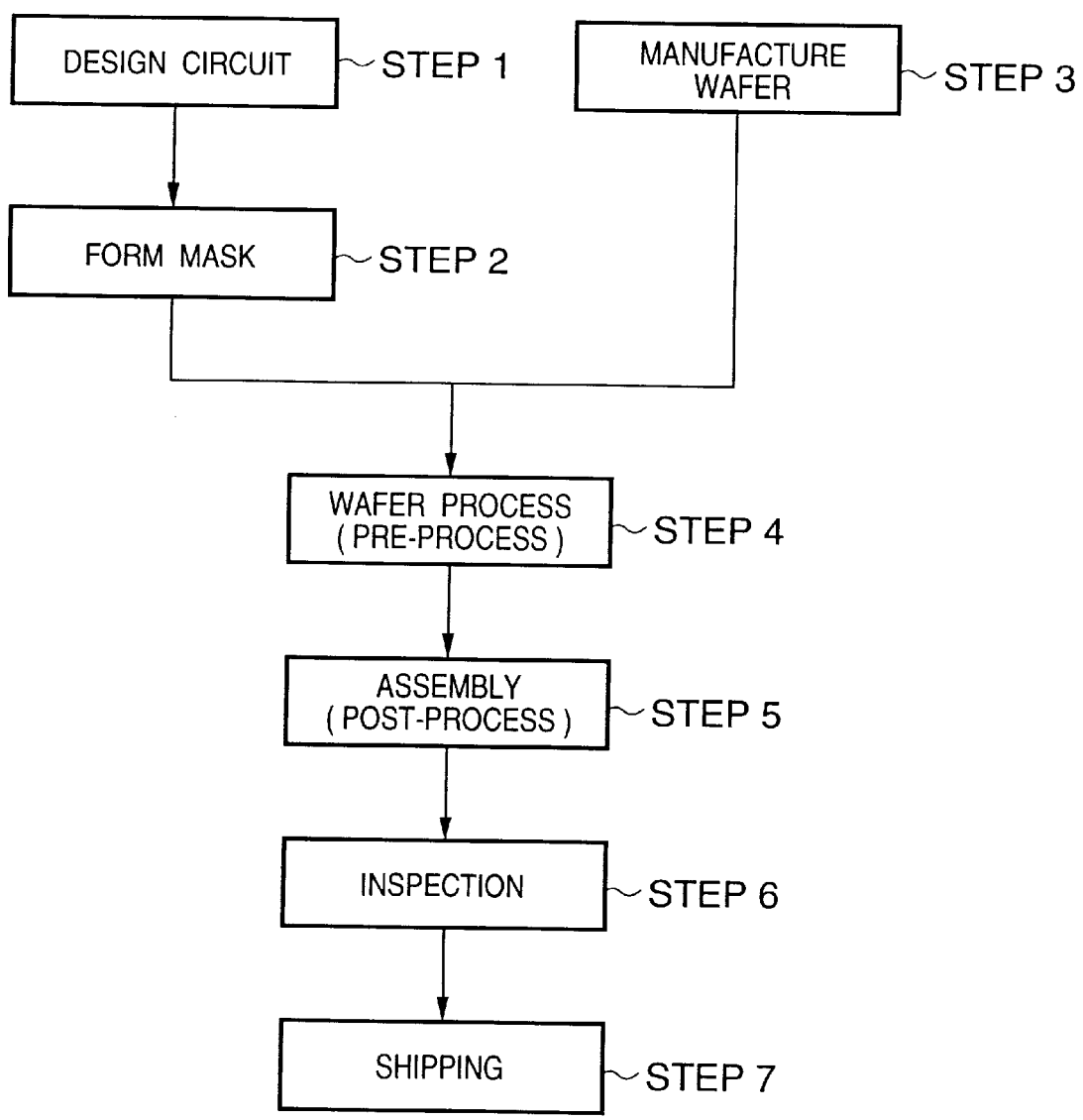
FIG. 8 is a flow chart for explaining the flow of a device manufacturing process by the exposure apparatus according to the embodiment of the present invention.

A semiconductor device manufacturing process using the above-described production system will be explained. FIG. 8 shows the flow of the whole manufacturing process of the semiconductor device. In step 1 (circuit design), a semiconductor device circuit is designed. In step 2 (mask formation), a mask having the designed circuit pattern is formed. In step 3 (wafer manufacture), a wafer is manufactured by using a material such as silicon. In step 4 (wafer process) called a pre-process, an actual circuit is formed on the wafer by lithography using a prepared mask and the wafer. Step 5 (assembly) called a post-process is the step of forming a semiconductor chip by using the wafer manufactured in step 4, and includes an assembly process (dicing and bonding) and a packaging process (chip encapsulation). In step 6 (inspection), inspections such as the operation confirmation test and durability test of the semiconductor device manufactured in step 5 are conducted. After these steps, the semiconductor device is completed and shipped (step 7). For example, the pre-process and post-process are performed in separated dedicated factories, and maintenance is done for each of the factories by the above-described remote maintenance system. Information for production management and apparatus maintenance is communicated between the pre-process factory and the post-process factory via the Internet or dedicated network.

Figure 9:
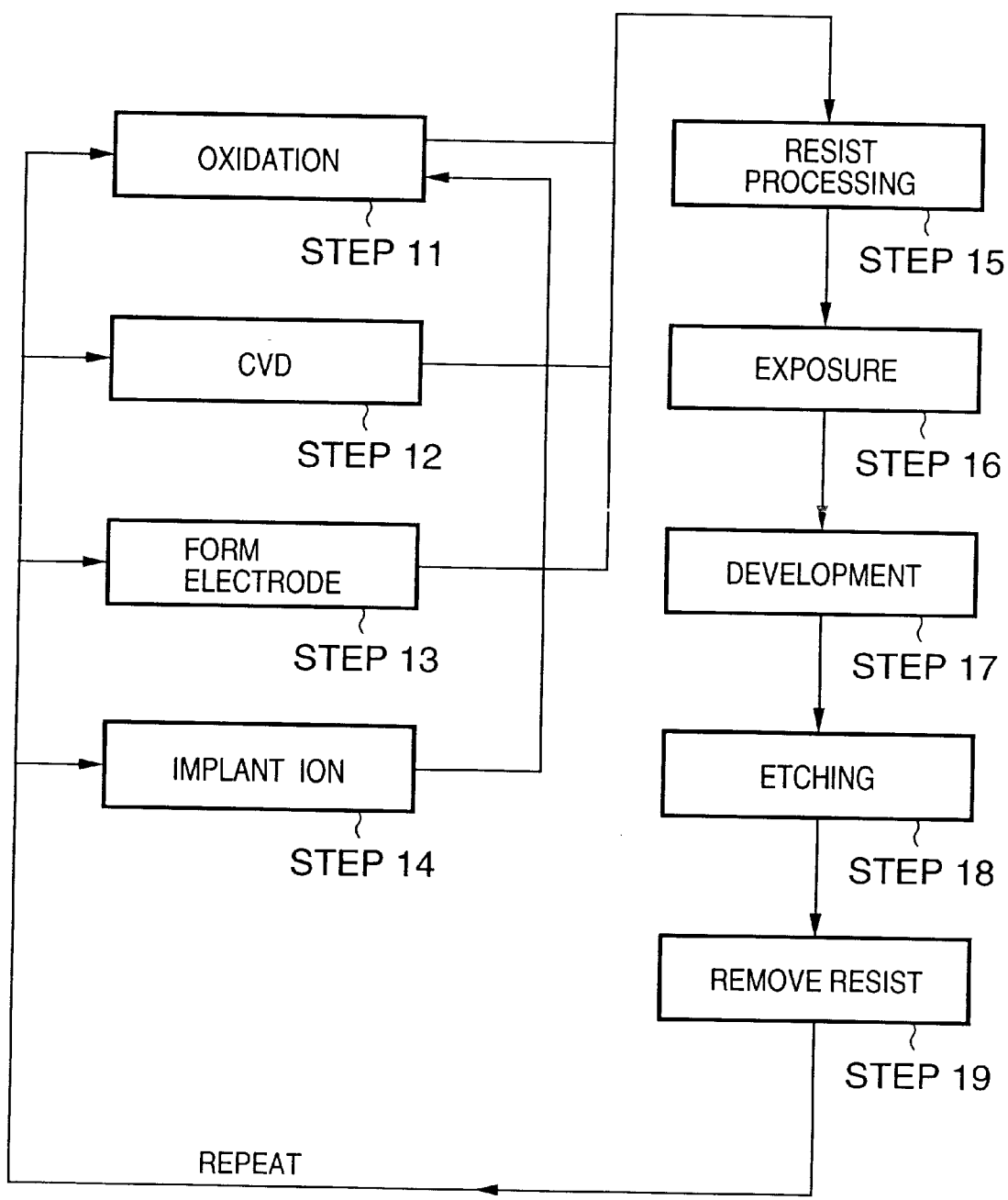
FIG. 9 is a flow chart for explaining a wafer process by the exposure apparatus according to the embodiment of the present invention.
Figure 10:
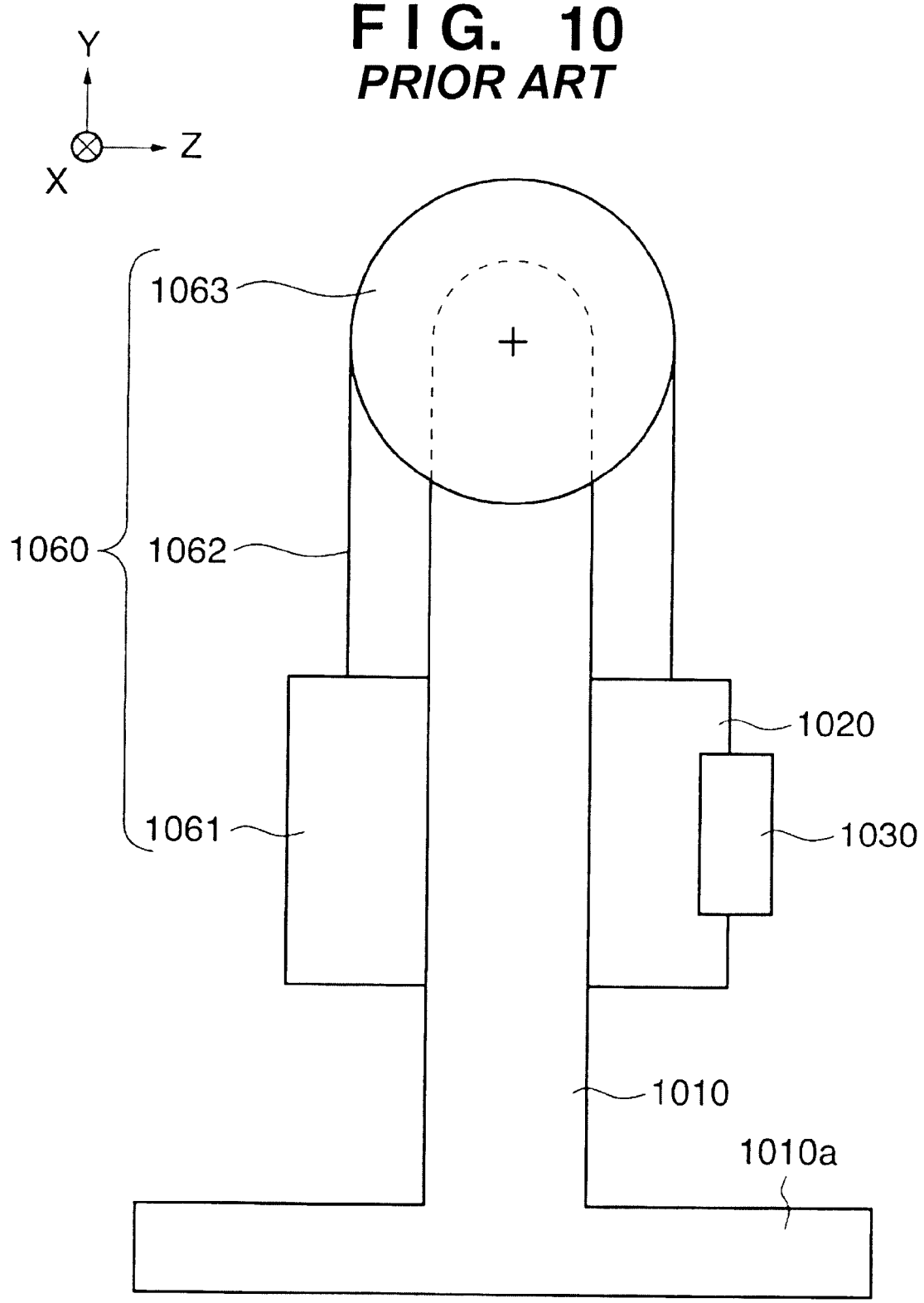
FIG. 10 is a schematic view showing the pulley weight compensation mechanism of a vertical stage according to the prior art.

FIG. 9 shows the detailed flow of the wafer process. In step 11 (oxidation), the wafer surface is oxidized. In step 12 (CVD), an insulating film is formed on the wafer surface. In step 13 (electrode formation), an electrode is formed on the wafer by vapor deposition. In step 14 (ion implantation), ions are implanted in the wafer. In step 15 (resist processing), a photosensitive agent is applied to the wafer. In step 16 (exposure), the above-mentioned exposure apparatus exposes the wafer to the circuit pattern of a mask. In step 17 (developing), the exposed wafer is developed. In step 18 (etching), the resist is etched except for the developed resist image. In step 19 (resist removal), an unnecessary resist after etching is removed. These steps are repeated to form multiple circuit patterns on the wafer. A manufacturing apparatus used in each step undergoes maintenance by the remote maintenance system, which prevents trouble in advance. Even if trouble occurs, the manufacturing apparatus can be quickly recovered. The productivity of the semiconductor device can be increased in comparison with the prior art.

In this fashion, the weight compensation mechanism of the embodiment can be applied even when the load on the pulley is large, which widens the range of applications to the stage apparatus.

The stage apparatus can be suitably used for an exposure apparatus, a measurement apparatus, and a processing apparatus.

As has been described above, the present invention can increase the load-carrying capacity of a hydrostatic bearing for supporting a pulley shaft in the weight compensation apparatus using the pulley.

As many apparently widely different embodiments of the present invention can be made without departing from the spirit and scope thereof, it is to be understood that the invention is not limited to the specific embodiments thereof except as defined in the claims.

What is claimed is:

1. A weight compensation apparatus for compensating for a weight of a stage that is movable along a vertical reference plane, said apparatus comprising:
    a pulley having a pulley shaft;
    a belt which is wound around and supported by said pulley and has the stage at one end and a counter mass corresponding to the stage at the other end;
    a hydrostatic bearing which has an arcuated bearing portion and supports the pulley shaft by causing a fluid to flow into a bearing gap between the bearing portion and the pulley shaft; and
    a thrust bearing mechanism for resisting axial motion of said pulley by causing the fluid to flow into a gap between a thrust bearing portion and a side surface of said pulley.

2. The apparatus according to claim 1, wherein
    the bearing portion of said hydrostatic bearing includes a portion made of a porous material, and
    the fluid is supplied to the bearing gap via the porous material.

3. The apparatus according to claim 1, wherein said hydrostatic bearing is made of a magnetic material.

4. The apparatus according to claim 1, wherein said hydrostatic bearing comprises an electromagnet.

5. The apparatus according to claim 1, further comprising plural sets of said pulley, said belt and said hydrostatic bearing, wherein the stage is movable two-dimensionally along the vertical reference plane.

6. A stage apparatus comprising:
    a stage which moves in at least a vertical direction along a vertical reference plane;
    a pulley disposed above said stage, said pulley having a pulley shaft;
    a belt which is wound around and supported by said pulley and has said stage at one end and a counter mass corresponding to said stage at the other end;
    a hydrostatic bearing which has an arcuated bearing portion and supports the pulley shaft by causing a fluid to flow into a bearing gap between the bearing portion and the pulley shaft; and
    a thrust bearing mechanism for resisting axial motion of said pulley by causing the fluid to flow into a gap between a thrust bearing portion and a side surface of said pulley.

7. The apparatus according to claim 6, further comprising a damper for adjusting at least one of a tension and an effective length of said belt in order to provide damping in accordance with displacement of said stage.

8. The apparatus according to claim 6, wherein
    the bearing portion of said hydrostatic bearing includes a portion made of a porous material, and
    the fluid is supplied to the bearing gap via the porous material.

9. The apparatus according to claim 6, wherein said hydrostatic bearing is made of a magnetic material.

10. The apparatus according to claim 6, wherein said hydrostatic bearing comprises an electromagnet.

11. An exposure apparatus comprising:
    the stage apparatus defined in claim 6;
    an exposure light source for generating exposure light;
    a first holder for holding a mask;
    a second holder for holding an object to be exposed on a stage; and
    an exposure controller for irradiating the object held by said second holder with the exposure light having passed through the mask held by said first holder, while moving the stage apparatus.

12. The apparatus according to claim 11,
    the exposure apparatus further comprising a display, a network interface, and a computer for executing network software,
    wherein maintenance information of the exposure apparatus is communicated via said computer network.

13. The apparatus according to claim 12, wherein the network software is connected to an external network of a factory in which the exposure apparatus is installed, provides on said display a user interface for accessing a maintenance database provided by a vendor or user of the exposure apparatus, and enables obtaining information from the database via the external network.

14. A device manufacturing method comprising the steps of:
    installing a plurality of semiconductor manufacturing apparatuses including an exposure apparatus in a factory; and manufacturing a semiconductor device by using the plurality of semiconductor manufacturing apparatuses, wherein the exposure apparatus includes the stage apparatus defined in claim 7, an exposure light source for generating exposure light, a first holder for holding a mask, a second holder for holding an object to be exposed on a stage, and an exposure controller for irradiating the object held by the second holder with the exposure light having passed through the mask held by the first holder, while moving the stage apparatus.

15. The method according to claim 14, further comprising the steps of:

connecting the plurality of semiconductor manufacturing apparatuses by a local area network;

connecting the local area network to an external network outside the factory;

acquiring the information about an X-ray exposure apparatus from a database on the external network by using the local area network and the external network; and controlling the X-ray exposure apparatus on the basis of the acquired information.

16. The method according to claim 15, wherein a database provided by a vendor or user of the exposure apparatus is accessed via the external network to obtain maintenance information of the manufacturing apparatus by data communication, or production management is performed by data communication between the semiconductor manufacturing factory and another semiconductor manufacturing factory via the external network.

17. A semiconductor manufacturing factory comprising:

a plurality of semiconductor manufacturing apparatuses including an exposure apparatus;

a local area network for connecting said plurality of semiconductor manufacturing apparatuses; and a gateway which allows the local area network to access an external network outside the factory, wherein the exposure apparatus includes the stage apparatus defined in claim 7, an exposure light source for generating exposure light, a first holder for holding a mask, a second holder for holding an object to be exposed on a stage, and an exposure controller for irradiating the object held by the second holder with the exposure light having passed through the mask held by the first holder, while moving the stage apparatus.

18. An exposure apparatus maintenance method comprising the steps of:

preparing a database for accumulating information about maintenance of the exposure apparatus, on an external network outside a factory in which an exposure apparatus is installed;

connecting the exposure apparatus to a local area network in the factory; and maintaining the exposure apparatus on the basis of the information accumulated in the database by using the external network and the local area network, wherein the exposure apparatus includes the stage apparatus defined in claim 6, an exposure light source for generating exposure light, a first holder for holding a mask, a second holder for holding an object to be exposed on a stage, and an exposure controller for irradiating the object held by the second holder with the exposure light having passed through the mask held by the first holder, while moving the stage apparatus.

19. The apparatus according to claim 6, further comprising plural sets of said pulley, said belt and said hydrostatic bearing, wherein the stage is movable two-dimensionally along the vertical reference plane.

* * * * *

UNITED STATES PATENT AND TRADEMARK OFFICE
CERTIFICATE OF CORRECTION

PATENT NO. : 6,658,083 B2
DATED : December 2, 2003
INVENTOR(S) : Choshoku Sai

It is certified that error appears in the above-identified patent and that said Letters Patent is hereby corrected as shown below:

<u>Title Page,</u>
Item [56], References Cited, U.S. PATENT DOCUMENTS, "3,703,322 A * 11/1972 Gustafsson ………………..384/116" should read -- 3,703,322 A * 11/1971 Gustafsson ………………..384/116 --.

<u>Column 8,</u>
Line 19, "trouble be" should read -- trouble can be --.

Signed and Sealed this

Fifteenth Day of June, 2004

JON W. DUDAS
*Acting Director of the United States Patent and Trademark Office*